United States Patent [19]

Matsuda et al.

[11] Patent Number: 4,833,518

[45] Date of Patent: May 23, 1989

[54] SEMICONDUCTOR MEMORY DEVICE HAVING IMPROVED INTERCONNECTION STRUCTURE OF MEMORY CELL ARRAY

[75] Inventors: Yoshio Matsuda; Koichiro Mashiko; Kazutami Arimoto; Noriaki Matsumoto; Kiyohiro Furutani, all of Hyogo, Japan

[73] Assignee: Mitsubishi Denki Kabushiki Kaisha, Tokyo, Japan

[21] Appl. No.: 94,646

[22] Filed: Sep. 9, 1987

[30] Foreign Application Priority Data

Sep. 9, 1986 [JP] Japan .................................. 61-213105

[51] Int. Cl.⁴ ...................... H01L 27/10; H01L 27/02; H01L 29/78; H01L 29/04
[52] U.S. Cl. ......................................... 357/45; 357/41; 357/23.6; 357/59
[58] Field of Search ................... 357/41, 45, 59 J, 23.6

[56] References Cited

U.S. PATENT DOCUMENTS 4,412,237 10/1983 Matsumura et al. .................. 357/45

FOREIGN PATENT DOCUMENTS 61-110459 5/1986 Japan .

Primary Examiner—Andrew J. James
Assistant Examiner—Robert P. Limanek
Attorney, Agent, or Firm—Lowe, Price, LeBlanc, Becker & Shur

[57] ABSTRACT

A memory cell array is divided into two groups, one bit line of a pair of bit lines is connected to corresponding memory cells in the first group of the memory cell array, and the other bit line thereof is connected to corresponding memory cells in the second group of the memory cell array.

3 Claims, 4 Drawing Sheets ary array is divided into a first
group of bit lines being connected to a memory cell
included in the first group of the memory cell array and
a second bit line thereof being connected to a memory
cell included in the second group of the memory cell
array.
SEMICONDUCTOR MEMORY DEVICE HAVING IMPROVED INTERCONNECTION STRUCTURE OF MEMORY CELL ARRAY

BACKGROUND OF THE INVENTION

1. Field of the Invention

A present invention relates to a semiconductor memory device and more particularly, to an improvement of an interconnection structure in a memory cell array in an MOS (Metal-Oxide Semiconductor) dynamic RAM (Random Access Memory) or the like.

2. Description of the Prior Art

FIG. 1A is a plan view showing a pattern of a part of a conventional semiconductor memory device having information charge storage capacitance formed on an oblique surface (side surface) of a trench isolation region. FIG. 1B is a cross sectional view taken along a line X-X' of the semiconductor memory device shown in FIG. 1A. In FIGS. 1A and 1B, a trench isolation region 2 for isolating memory cells is formed on a semiconductor substrate SUB. The trench isolation region 2 is formed not to contact a channel region 6 of a transfer transistor constituting the memory cells, but to surround the channel region 6. An n+ diffusion region 1 constituting one electrode of information charge storage capacitance is formed in a part of a flat portion of the semiconductor substrate SUB and an oblique surface 3 of the side surface of the trench isolation region 2. A thin oxide film 20 is formed on the n+ diffusion region 1. In addition, an oxide film 21 is formed in the bottom of the trench isolation region 2. A p+ layer 22 channel stop is formed in the lower portion of the oxide film 21. An opposing electrode 4 formed of first polysilicon is formed on the oxide films 20 and 21. Since the opposing electrode 4 is opposite to the n+ diffusion region 1 with the oxide film 20 interposed therebetween, the opposing electrode 4 comprises the other electrode of the information charge storage capacitance. Thus, in the semiconductor memory device shown in FIGS. 1A and 1B, information charge storage capacitance is formed not only in the flat portion of the semiconductor substrate SUB but also on the side surface of the trench isolation region 2. Furthermore, a plurality of word lines 5 formed of second polysilicon, a plurality of bit lines 7a, 7b, 7c, 7d, ... formed of third polysilicon or aluminum to intersect with the word lines 5 are formed in the upper portion of the semiconductor substrate SUB. Each of the bit lines is electrically connected to the n+ diffusion region 1 through an opening 8.

Since the above described semiconductor memory device utilizes the oblique surface portion 3 of the trench isolation region 2 in a peripheral portion of the memory cells as information charge storage capacitance, the area of the flat portion forming the information charge storage capacitance is decreased, operating margin is sufficiently wide even if the chip area is decreased, and information charge storage capacitance capable of holding memory information charges relative to minority carriers injected by radioactive rays such as alpha rays can be ensured. The longer the peripheral length of the memory cell to be utilized is, the shallower the depth of the trench required to obtain the information charge storage capacitance may be.

FIG. 2 is a diagram showing diagrammatically a memory cell array structure when folded bit lines are applied to the semiconductor memory device shown in FIGS. 1A and 1B. A portion enclosed by a dotted line in FIG. 2 substantially corresponds to the semiconductor memory device shown in FIG. 1A. Referring to FIG. 2, a trench isolation region 14 represented by oblique lines is formed to surround a memory cell 9. In addition, adjacent two bit lines out of bit lines 111 to 118 formed to intersect with a plurality of word lines 101 to 108 are connected to an identical sense amplifier 13. Two bit lines connected to the identical sense amplifier 13 constitutes a pair of bit lines. In FIG. 2, the bit lines 111 and 112, 113 and 114, 115 and 116, and 117 and 118 are paired, respectively. One bit line of a pair of bit lines provides contact to the memory cell 9 through an opening 12 (which corresponds to the opening 8 represented diagrammatically in FIG. 1A) arranged every other one memory cell 9. Furthermore, the other bit line out of a pair of bit lines provides contact to the memory cell 9 through the opening 12 arranged to be shifted by one pitch between the above described one bit line and the memory cell 9. Thus, the opening 12 exists with respect to each bit line.

Meanwhile, when the minimum standard of design is applied to the above described semiconductor memory device, an interval between bit lines is defined by a coverage portion surrounding a contact portion of the bit lines (a space provided to surround the opening 8 in FIG. 1A). For example, an interval between the bit lines 7a and 7b is limited by a coverage portion of both bit lines, because the coverage portion surrounding a contact portion of the bit lines is projected inward. Thus, the bit lines can not be arranged at a high density. It is the same with the bit lines 7c and 7d. As a result, capacitance between the bit lines 7a and 7b and capacitance between the bit lines 7b and 7c become unbalanced. In addition, the trench isolation region 14 has a complicated shape such as bricks laid as shown in FIG. 2, so that variation in the process (for example, offset of a mask and variation in depth of a trench) is increased.

SUMMARY OF THE INVENTION

An object of the present invention is to solve the aboe described problems and to provide a semiconductor memory device capable of arranging bit lines at a high density.

Briefly stated, the present invention is directed to a semiconductor memory device having an information charge storage region formed on the side surface of a trench isolation region for isolating memory cells, wherein a memory cell array is divided into a first group of bit lines being connected to a memory cell included in the first group of the memory cell array and a second bit line thereof being connected to a memory cell included in the second group of the memory cell array.

According to the present invention, since a memory cell array is divided into two groups, one bit line of each pair of bit lines is connected to corresponding memory cells in a first group and the other bit line thereof is connected to corresponding memory cells in a second group, limitation caused by a coverage portion surrounding a contact portion of bit lines of a factor for limiting an interval between the bit lines in each group can be reduced by half, as compared with the conventional semiconductor memory device. Thus, the arrangement at high density of bit lines can be obtained. As a result, an interval between bit lines which is limited by the coverage portion and an interval between bit lines which is not limited can be almost equal, so that unbalance of capacitance between bit lines can be solved. Furthermore, since an information charge storage region is formed on the side surface of a trench isolation for isolating memory cells, the chip area can be decreased and a semiconductor memory device in which stored information is not easily destroyed relative to radioactive rays such as alpha particles can be obtained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
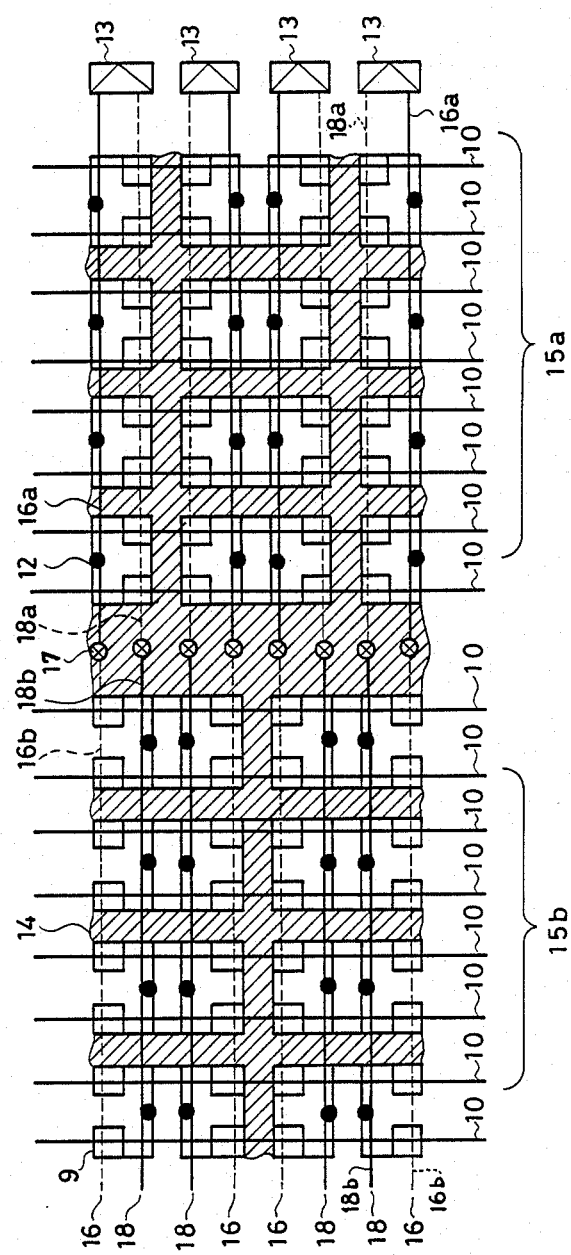
FIG. 3 is a diagram showing diagrammatically a memory cell array structure of a semiconductor memory device according to an embodiment of the present invention.
Figure 4:
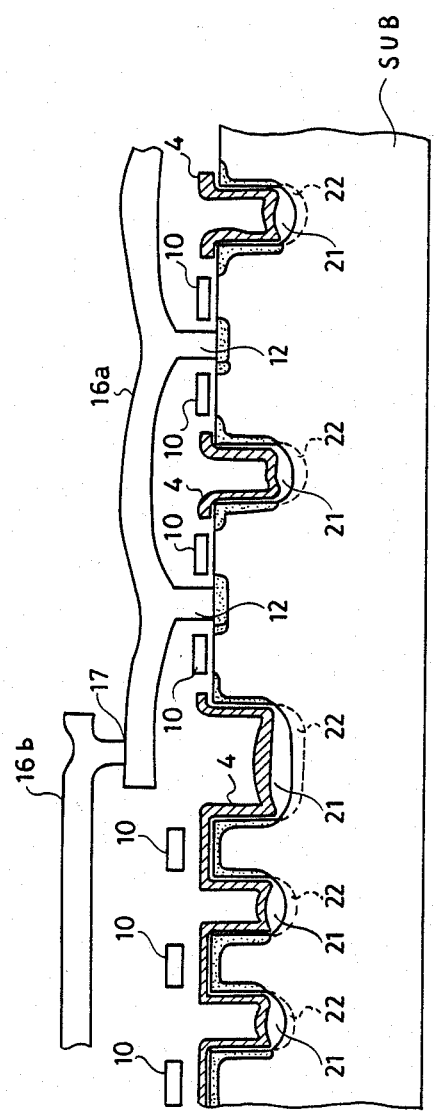
FIG. 4 is a cross sectional view taken along a bit line 16 shown in FIG. 3.

FIG. 3 is a diagram showing diagrammatically a memory cell array structure of a semiconductor memory device according to an embodiment of the present invention. FIG. 4 is a cross sectional view taken along a bit line 16 shown in FIG. 3. In FIG. 4, the same portions as those in FIG. 1B have the same reference numerals. Referring to FIGS. 3 and 4, the semiconductor memory device according to the present embodiment comprises a memory cell array divided into two groups, that is, a first block 15a and a second block 15b with a connection portion 17 interposed therebetween. A plurality of word lines 10 are arranged in parallel with each other in the memory cell array comprising the blocks 15a and 15b. In addition, a plurality of bit lines 16 and a plurality of bit lines 18 are provided to intersect with the word lines 10, respectively. Adjacent two bit lines 16 and 18 are paired and connected to an identical sense amplifier 13. Thus, the present embodiment is applied to a so-called folded bit line structure. A first portion 16a, which passes on the first block 15a, of the bit line 16 is formed of a first interconnection layer, and is electrically connected to a memory cell 9 in the first block 15a through an opening 12. Furthermore, a second portion 16b, which passes on the second block 15b, of the bit line 16 is formed of a second interconnection layer, and is not electrically connected to the memory cell 9 in the second block 15b. Thus, the opening 12 does not exist under the second portion 16b of the bit line 16. The first portion 16a and the second portion 16b of the bit line 16 are electrically connected in the connection portion 17. On the other hand, a first portion 18a, which passes on the first block 15a, of the bit line 18 is formed of the second interconnection layer, and is not electrically connected to the memory cell 9 in the first block 15a. Thus, the opening 12 does not exist under the first portion 18a. In addition, the second portion 18b which passes on the second block 15b, of the bit line 18 is formed of the first interconnection layer, and is electrically connected to the memory cell 9 in the second block 15b through the opening 12. The first portion 18a and the second portion 18b of the bit line 18 are electrically connected in the connection portion 17.

Figure 1A:
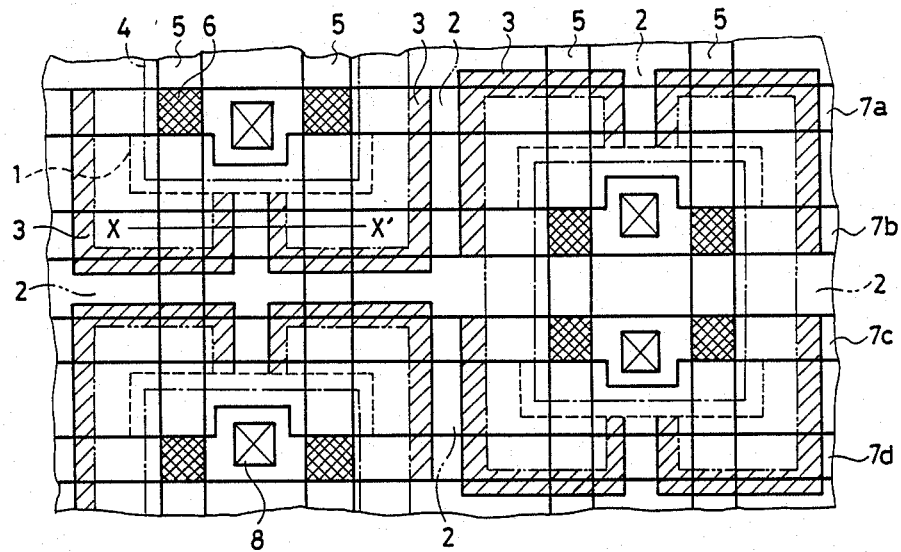
FIG. 1A is a plan view showing a pattern of a part of a memory cell array of a conventional semiconductor memory device.
Figure 1B:
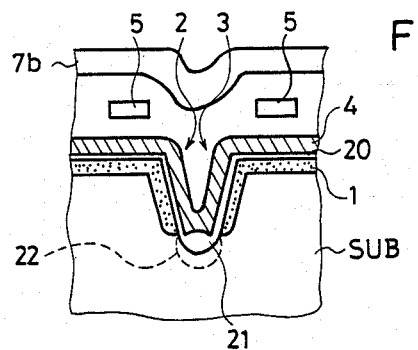
FIG. 1B is a cross sectional veiw taken along a line X-X' shown in FIG. 1A.
Figure 2:
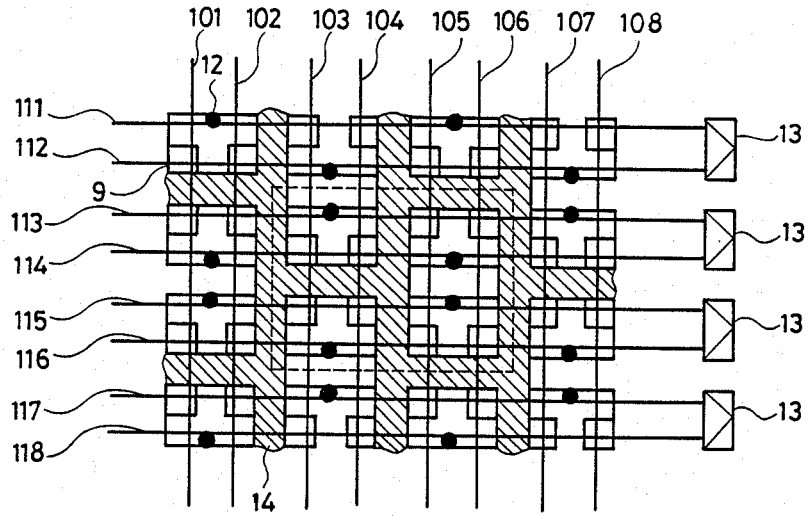
FIG. 2 is a diagram showing diagrammatically a memory cell array structure when memory cells shown in FIG. 1 is applied to a folded bit line structure.

In the above described structure, if the first interconnection layer forming the bit line comprises, for example, aluminum and the second interconnection layer forming the bit line comprises, for example, polysilicon, the paired bit lines 16 and 18 are formed in separate layers in each of the blocks 15a and 15b, so that an interval between bit lines in an identical layer becomes twice, as compared with the conventional semiconductor memory device shown in FIGS. 1A and 1B. Thus, capacitance between bit lines is decreased, and immunity to noise and the arrangement at high density can be obtained. As clear from FIG. 3, since the openings 12 are regularly arranged every memory cell along a longitudinal direction of bit lines, a trench isolation region 14 becomes simple in shape, so that variation in the manufacturing process can be decreased.

Although in the above described embodiment, the first interconnection layer forming the bit line comprises aluminum and the second interconnection layer comprises polysilicon, contrary to this, the first interconnection layer may comprise polysilicon and the second interconnection layer may comprise aluminum.

Additionally, the first and second interconnection layers of the bit line may comprise an identical interconnection layer such as aluminum. In this case, since contact portions exist only in the bit lines 18 in the first block 15a of the memory cell array, an interval between bit lines is limited only by a coverage portion surrounding the contact portion of the bit lines 18. Therefore, the limitation of the interval between bit lines is reduced by half, as compared with the conventional semiconductor memory device, so that the arrangement at high density can be obtained. Thus, even in this case, capacitance between bit lines can be decreased and immunity to noise is obtained. Furthermore, similarly to the above described embodiment, the shape of the trench isolation region 14 can be simplified.

Although in the above described embodiment, a semiconductor memory device having a folded bit line structure is described, the present invention can be applied to a semiconductor memory device having another bit line structure.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A semiconductor memory device comprising a memory cell array having a plurality of memory cells each including a transistor having a channel region, a plurality of word lines formed in the memory cell array symmetrically about a center connecting portion of the array, and a plurality of pairs of adjacent bit lines formed orthogonal to and intersecting with the word lines at said cells, said memory cell array comprising a trench isolation region for isolating said memory cells from the channel region of each transistor, and an information charge storage region on the side surface of the trench isolation region surrounding the channel region, wherein
- said memory cell array is divided into a first group of memory cells disposed on one side of said center connecting portion and a second group of memory cells disposed on the opposite side of said center connecting portion,
- each of first bit lines of said pairs of bit lines is connected only to corresponding memory cells included in said first group of the memory cell array, and
- each of second bit lines of said pairs of bit lines is connected only to corresponding memory cells included in said second group of the memory cell array.

2. A semiconductor memory device in accordance with claim 1, wherein
- a portion of each of said first bit lines is formed of a first interconnection layer, the other portion thereof is formed of a second interconnection layer, and the first interconnection layer and the second interconnection layer are connected in place, and
- a portion of each of said second bit lines is formed of said first interconnection layer, the other portion thereof is formed of said second interconnection layer, and the first interconnection layer and the second interconnection layer are connected in place.

3. A semiconductor memory device in accordance with claim 2, wherein
- a portion of each of said first bit lines connected to the memory cells in said first group of the memory cells array and a portion of each of said second bit lines connected to the memory cells in said second group of the memory cell array are formed of said first interconnection layer, and
- the remaining portions of said first bit lines and said second bit lines are formed of said second interconnection layer.

* * * * *